United States Patent [19]

Miller et al.

[11] Patent Number: 4,515,480

[45] Date of Patent: May 7, 1985

[54] PATTERN ALIGNMENT SYSTEM AND METHOD

[75] Inventors: William I. Miller, Campbell; Robert D. Reimiller, Sunnyvale, both of Calif.

[73] Assignee: Micro Automation, Inc., Sunnyvale, Calif.

[21] Appl. No.: 366,368

[22] Filed: Apr. 7, 1982

Related U.S. Application Data

[63] Continuation of Ser. No. 151,418, May 19, 1980, abandoned.

[51] Int. Cl.³ .............................................. G01B 11/00
[52] U.S. Cl. .................................... 356/400; 356/394; 358/139
[58] Field of Search ............... 356/394, 398, 399, 400, 356/401; 358/106, 139, 160, 166

[56] References Cited

U.S. PATENT DOCUMENTS

| | | | |
|---|---|---|---|
| 4,097,750 | 3/1977 | Lewis et al. | 356/400 |
| 4,203,132 | 5/1980 | Schmitt et al. | 356/400 |
| 4,233,625 | 11/1980 | Altman | 356/400 |
| 4,242,702 | 12/1980 | Kuni et al. | 358/106 |

FOREIGN PATENT DOCUMENTS 6663  1/1980  European Pat. Off. ............ 356/376

*Primary Examiner*—R. A. Rosenberger
*Attorney, Agent, or Firm*—Flehr, Hohbach, Test, Albritton & Herbert

[57] ABSTRACT

A pattern recognition system for providing automatic alignment capability for a semiconductor wafer or other object. The system includes an integrator for electronically smearing input data representing the reflected light level of a scanned object, means for digitizing the smeared data, and processor means for determining the best match between the smeared, digitized data and predetermined stored data, thereby representing proper alignment of the wafer or other object.

8 Claims, 8 Drawing Figures

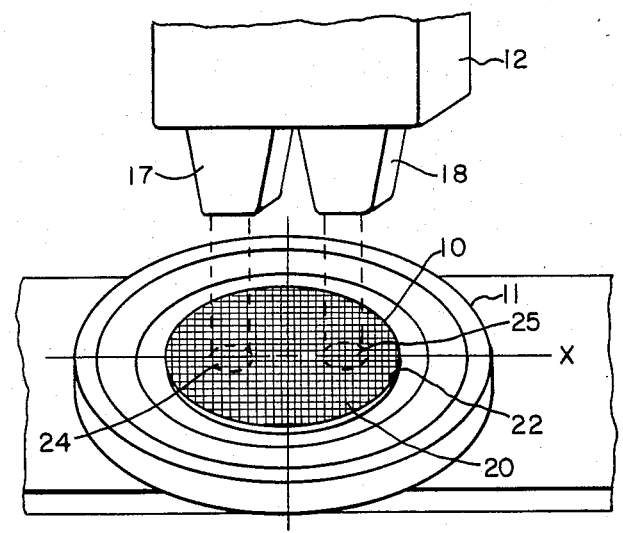
FIG.—1
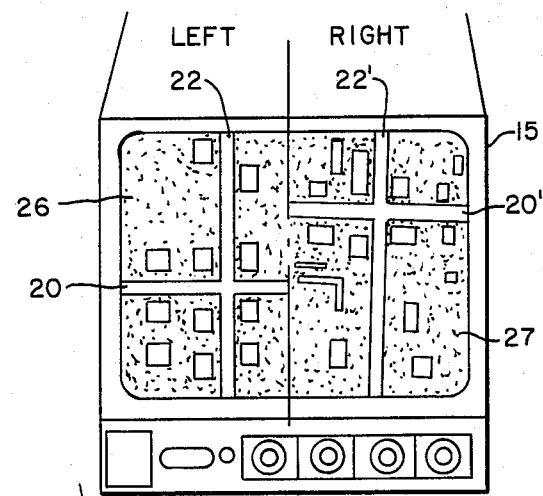
FIG.—2A
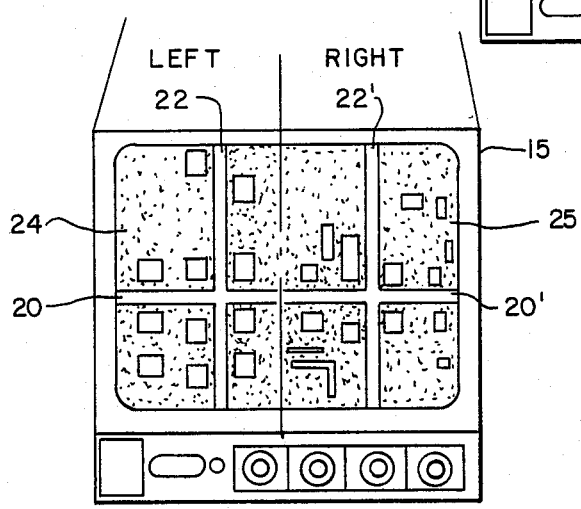
FIG.—2B

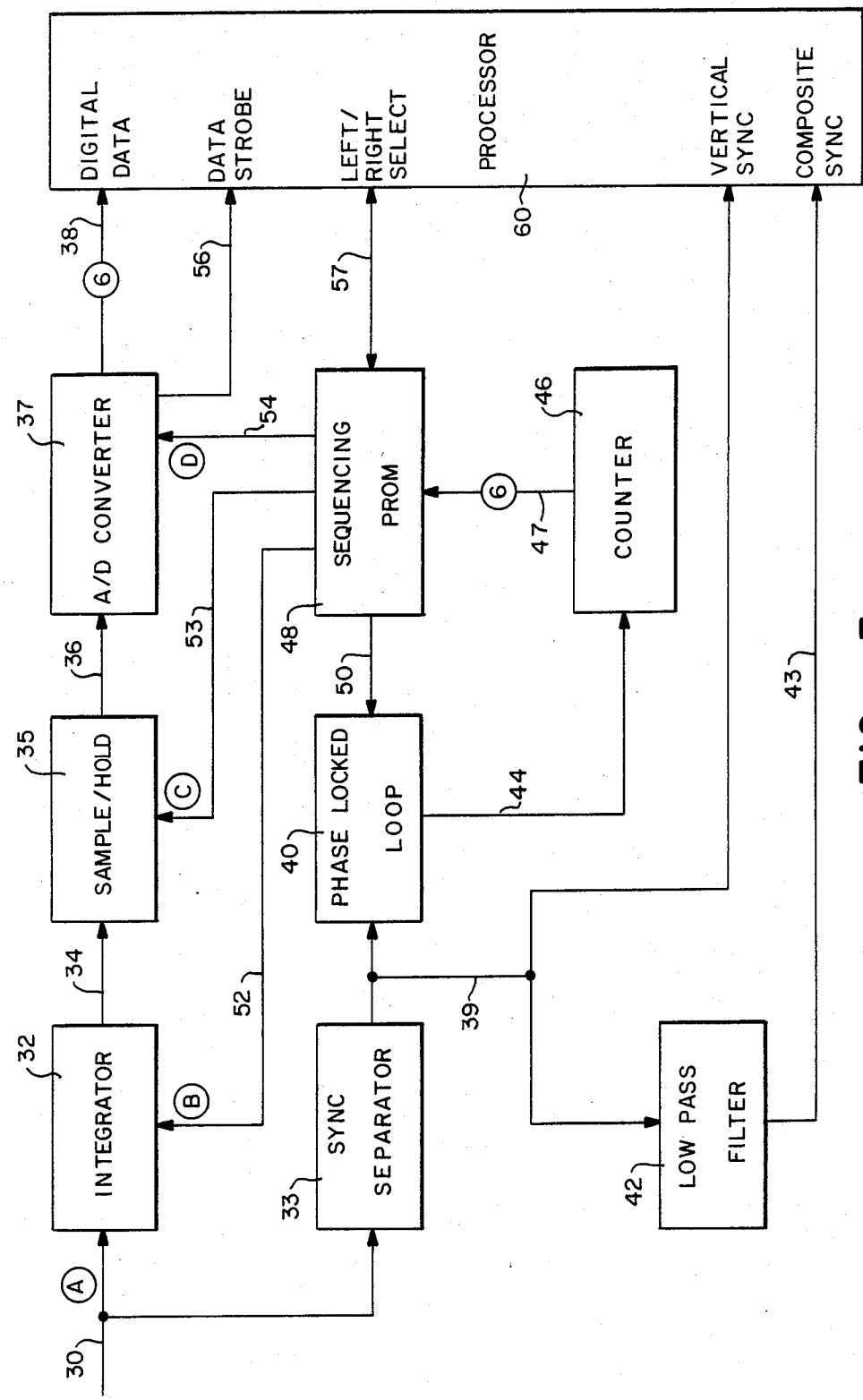
FIG.—3

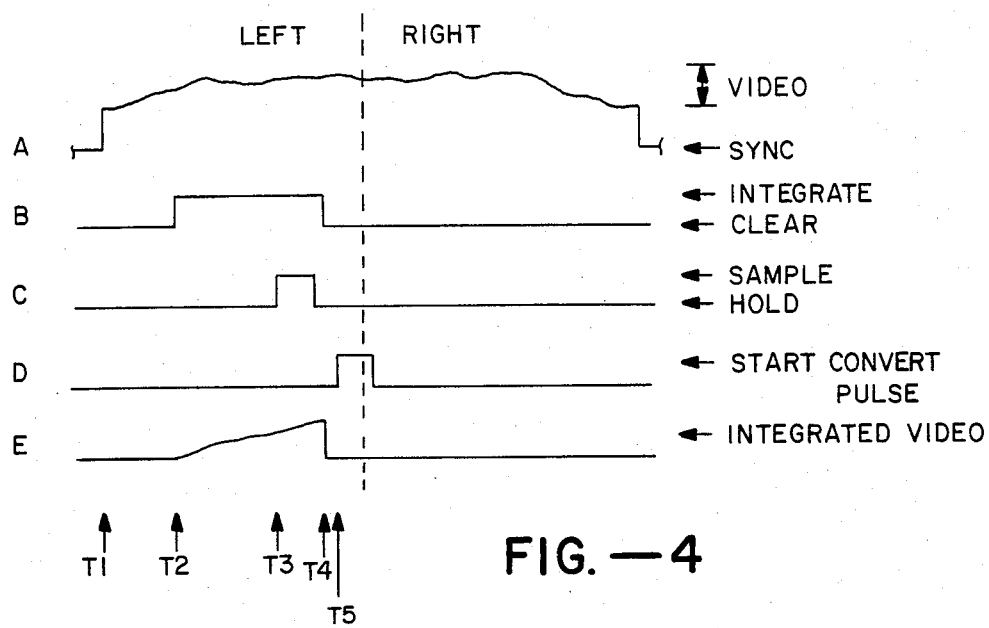
FIG.—4
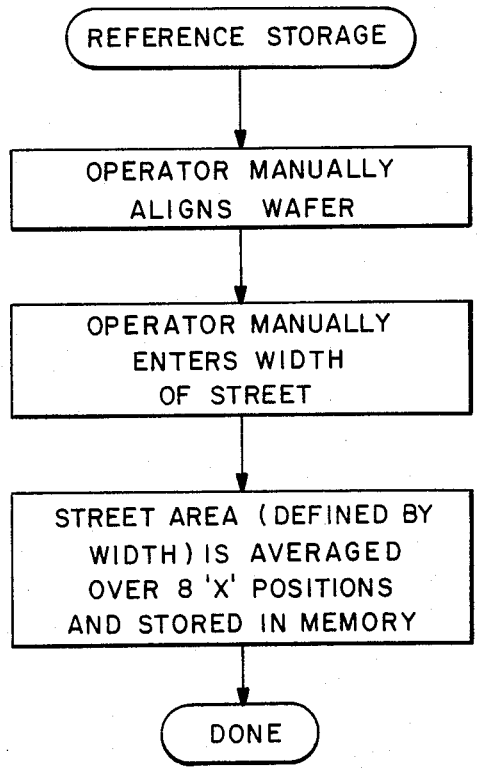
FIG.—5

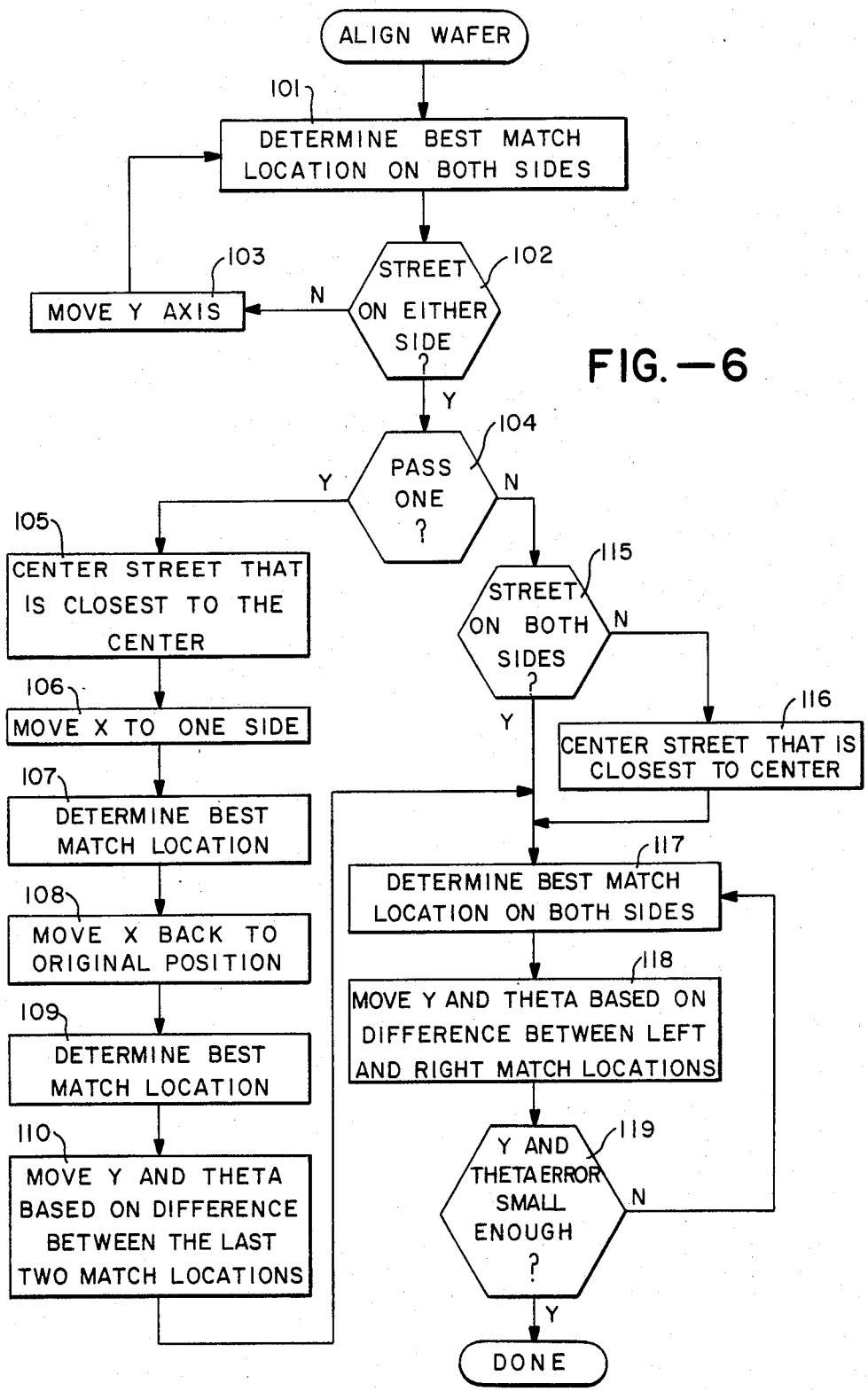
FIG.—6

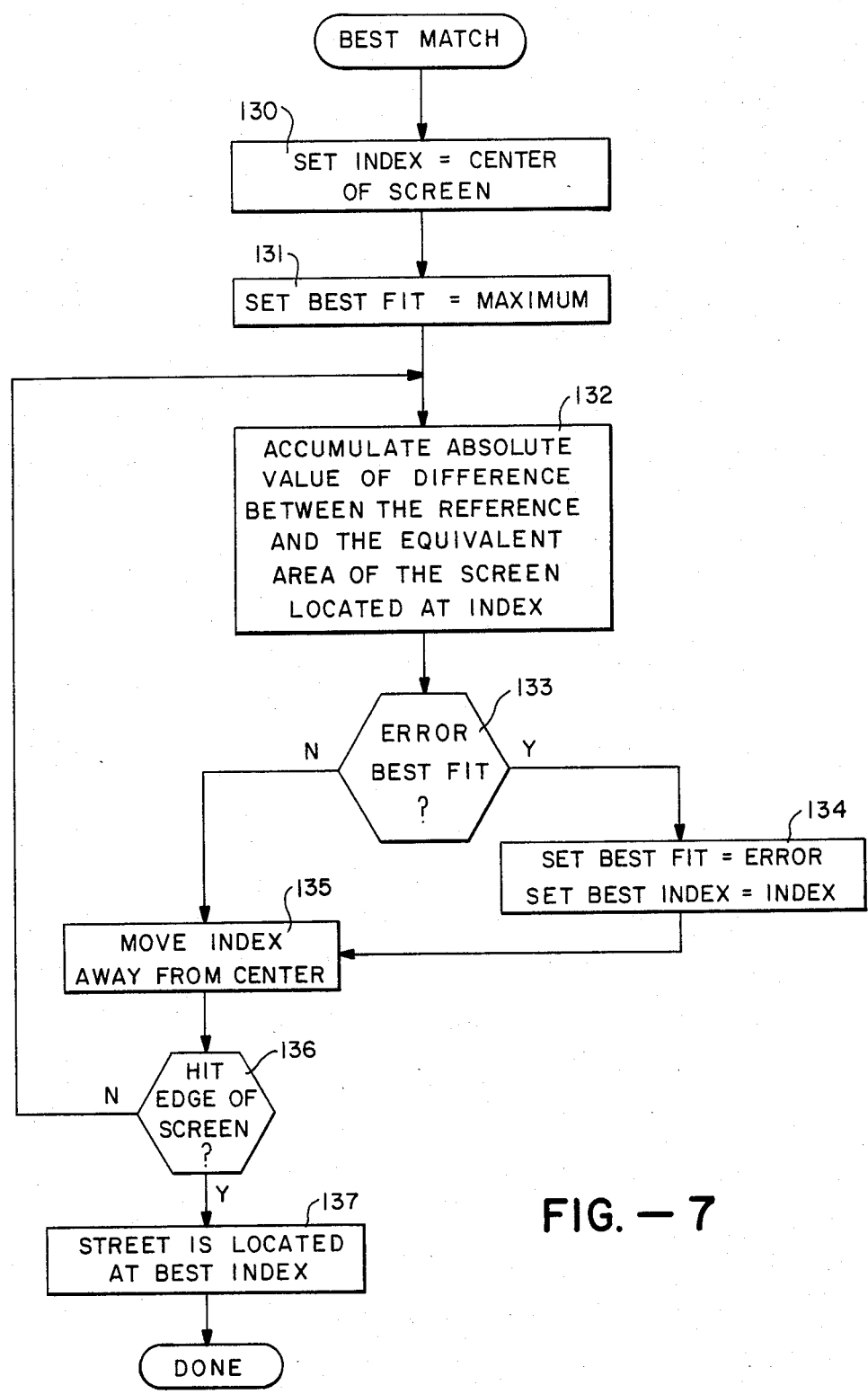
FIG.—7

PATTERN ALIGNMENT SYSTEM AND METHOD

This is a continuation, of application Ser. No. 151,418 filed May 19, 1980, now abandoned.

The present invention relates to a pattern recognition system and method.

In the integrated circuit field, a semiconductor wafer is formed containing a large number of chips formed thereon, the resulting pattern being a matrix arranged that individual chips are disposed in a checkerboard pattern sometimes referred to as street and avenue orientation.

In order to produce individual chips, it is necessary to properly align and cut narrow streets on the semiconductor wafer consistently and with minimum kerf loss. A serious problem which occurs with conventional systems is that many of the semiconductor chips contained on a wafer are damaged or rendered useless by misalignment of the wafer and the resultant improper cutting of the streets.

One prior art technique for aligning objects is disclosed in U.S. Pat. No. 4,097,750, which describes a method of optical "smearing" an image. A characteristic of the smearing phenomenon is that a line which is at a slight angle from the direction of smearing is less sharp than an image line parallel to the direction of smearing. For long narrow lines, substantial loss of sharpness occurs for very small angular deviations from the direction of smearing.

A disadvantage of prior art alignment techniques is the requirement of complex hardware and considerable data processing time in order to provide proper alignment of the semiconductor wafer.

In view of the above background, it is an objective of the present invention to provide an improved pattern recognition system and method.

SUMMARY OF THE INVENTION

The present invention and method relates to an improved pattern recognition system for use in the integrated circuit field.

The system includes integrator means connected to receive input data signals representing the reflected light level of a scanned object, typically from a semiconductor wafer. In response to the input signals, the integrator means electronically smears the input data signals and averages the smeared data signals over a predetermined integration time.

The system includes means for digitizing the smeared averaged data signals and means for determining the best match between the digitized data signals and predetermined stored data signals. The best match is an indication that the scanned object is in a properly aligned position.

In accordance with the above summary, the present invention achieves the objective of providing an improved pattern recognition system and method.

Other objects and features of the present invention will become apparent from the following detailed description when taken in conjunction with the accompanying drawings.

BRIEF DESCRIPTION OF THE DRAWINGS

FIG. 1 depicts a semiconductor wafer which is optically scanned by a television camera.

FIG. 2A depicts a non-aligned representation of a portion of the scanned wafer of FIG. 1.

FIG. 2B depicts an aligned representation of a portion of the scanned wafer of FIG. 1.

FIG. 3 depicts a diagram of a pattern recognition system according to the present invention.

FIG. 4 depicts a timing diagram for the pattern recognition system depicted in FIG. 3.

FIG. 5 depicts a flow chart for storing reference data.

FIG. 6 depicts a flow chart for aligning the semiconductor wafer of FIG. 1.

FIG. 7 depicts a flow chart for determining the best match for the alignment of the wafer of FIG. 1.

DETAILED DESCRIPTION OF THE DRAWINGS

Referring now to FIG. 1, there is depicted therein an illustration of a semiconductor wafer 10 oriented on an X-Y axis and supported by a chuck 11. The wafer 10 contains a large number of chips formed thereon with the pattern resulting therefrom being a matrix arranged such that the individual chips are disposed in a checkerboard pattern, sometimes referred to in the art as street and avenue orientation.

In FIG. 1, a street is depicted by the numeral 20 and an avenue is depicted by the numeral 22.

One such implementation of an improved alignment capability is for use with, for example, semiconductor dicing saws, such as with Micro Automation's Model 1006 Programmed Dicing Saw, which is a dicing saw which cuts narrow streets consistently with minimum kerf loss.

The chuck 11 in FIG. 1 corresponds to the single universal chuck disclosed in the Model 1006 Dicing Saw. The actual control of chuck 11 is well known in the art and need not be described in further detail, since the motor control does not form part of the present invention.

In FIG. 1, camera 12 provides dual-field or split-field optical scanning such as utilized with the above-referenced Programmed Dicing Saw.

The composite dual-field or split-field video data from camera 12 is displayed on conventional monitor 15, depicted in FIG. 2A.

In FIG. 2A, the left hand portion 26 of screen 15 depicts the portion 24 of the wafer 10 which is optically scanned by lens 17 of camera 12 in FIG. 1. Similarly, the right hand portion 27 of monitor 15 depicts the portion 25 of wafer 10 which is scanned by lens 18 of camera 12.

In FIG. 2A, a street 20 and an avenue 22 on the left-hand portion are shown misaligned with corresponding street 20' and avenue 22' on the right-hand portion of monitor 15, with 0 error (the rotational error)=1.3°.

It is one object of the present invention to provide for improved accuracy in aligning the streets and avenues depicted in FIG. 2A, so that accurate cutting can be achieved with a dicing saw. A properly aligned wafer is depicted in FIG. 2B, in which streets 20-20' are aligned for accurate cutting.

Referring now to FIG. 3, an improved pattern recognition system is depicted in which the split-field composite video data from camera 12 of FIG. 1 is input on bus 30 to integrator 32 and sync separator 33. In the preferred embodiment, split-field video data is utilized because of the desirability of aligning the desired streets in a more economical and accurate manner.

In FIG. 3, the composite input video data is input to sync separator 33, which removes synchronization data from the composite input signal. Composite sync data is input from separator 33 to processor 60 via bus 39.

Additionally, sync data is connected to low pass filter 42 which generates vertical sync data on bus 43 for connection to processor 60, which typically is Motorola's MC6809 microprocessor.

The function of integrator 32 is to electronically "smear" the composite input data in order to reduce the data to one "averaged" pixel rather than digitizing all of the input data, which requires considerably more data processing time.

As previously described, a characteristic of the prior art optical smearing technique is that a line which is at a slight angle from the direction of smearing is less sharp than an image line parallel to the direction of smearing. For long narrow lines, substantial loss of sharpness occurs for very small angular deviations from the direction of smearing. However, the prior art smearing technique generally requires a manual refocusing for each subsequent object to be aligned.

In contrast, the present invention compares each object (e.g., semiconductor wafer) to be recognized or aligned with predetermined stored data which corresponds to that object. The advantage of the present technique eliminates the refocusing requirement for each object. The present invention thereby provides the capability of "knowing" whether or not a wafer is properly aligned and how to compensate for misalignments.

The output of integrator 32 is connected via bus 34 to sample/hold circuit 35 which in turn is connected via bus 36 to A/D converter 37, which generates 6-bit digital data on bus 38 for connection to processor 60.

The sequencing or control of the smearing and digitizing of the data is controlled by sequencing PROM 48, which generates corresponding control signals for integrator 32, sample/hold circuit 35, and A/D converter 37 on buses 52, 53, 54, respectively.

A phase-locked loop (PLL) circuit 40 receives sync data from sync separator 33 and control signals on bus 50 from PROM 48 and in turn generates a control signal on bus 44 for connection to counter 46.

Counter 46 generates 6-bit address signals on bus 47 for generating the necessary control signals for buses 52, 53 and 54.

PROM 48 is also controlled by a left/right select signal on bus 57 from processor 60, which corresponds to the processing of the left- or right-hand portions of the split-field video data.

PLL 40, PROM 48 and counter 46 thereby provide synchronization means to control the proper timing for the operation of the pattern recognition system.

PLL 40 keeps the sequencing PROM 48 synchronized to incoming sync pulses and generates a control signal on bus 44 in order to control the speed of counter 46.

Referring now to FIG. 4, a timing diagram is depicted which illustrates the timing requirements of the pattern recognition system of FIG. 3 for smearing and digitizing the composite input data.

At time T1 in FIG. 4A, the synchronization pulse informs the system of the incoming video data. At time T2, PROM 48 generates necessary control signals on bus 52 to commence the integration of the input data in order to form the electronically smeared, averaged data on bus 34.

At time T3, the sample control signal on bus 53 is generated by PROM 48 and at time T4 the integration process is terminated.

At time T5, the start/convert pulse is generated by PROM 48 for connection to A/D converter 37 to convert the integrated smeared video data into 6-bit digital data.

In FIG. 4, only the timing for the left-hand portion of the composite data is illustrated. It is to be understood that the timing signals for the right-hand portion of the data would be in a similar format.

In order to provide for the proper alignment of a semiconductor wafer, a "control" wafer is first optically scanned and the "control" data is stored in processor 60 according to the flow chart depicted in FIG. 5. As additional wafers are scanned for proper alignment, the data is compared with the stored control data in order to determine the best match which is an indication that the desired wafer is in proper alignment.

In FIG. 5, reference or control data is stored in processor 60 when an operator manually aligns a control wafer, such as depicted in FIG. 1 and manually enters the width of a typical street, such as street 20. The width of a street on a semiconductor wafer is typically on the order of 3 mils.

The street area (which is defined by the width) is averaged over eight "X" positions and stored in a memory (not shown) contained within processor 60.

Proper alignment of additional semiconductor wafers is achieved by comparing composite input data representing a wafer with previously stored reference data from a control wafer. The stored control data could initially be generated when an operator of a dicing saw is assigned to cut a number of similar semiconductor wafers. Alternatively, control data could be generated well beforehand and retrieved from a memory location when necessary.

In order to provide improved alignment capabilities, the system must not only be capable of accurately distinguishing between vertical and horizontal translations, i.e., corresponding to X-Y axis, but in addition compensate for rotations (which is known in the art as $\theta$ error).

During alignment processing, it will be assumed for purposes of explanation that the $\theta$ error is less than 3 degrees. Two passes are typically utilized in order to provide the best alignment conditions for cutting of the semiconductor wafer.

Referring now to FIG. 5, in order to align a wafer, at step 101 processor 60 determines the best match location on both sides of the display in FIG. 2A. Processor 60 determines whether a street is on either side of the display on monitor 15 (step 102). If not, processor 60 generates necessary control signals to move the Y-axis of FIG. 1 (step 103).

Assuming a street is on either side of the display, at step 104 processor 60 determines whether a first pass of the wafer is involved. Assuming yes, at step 105, processor 60 centers the street that is closest to the center of the screen.

At step 106, the X-value is moved to one side (position) and at step 107 a determination of best match location is made.

At step 108 processor 60 moves the X value back to the original position and at step 109 processor 60 determines the best match location.

At step 110, the Y and $\theta$ coordinates are moved based upon differences between the last two match locations and processor 60 goes to step 117.

Now assuming that the second pass is initiated, processor 60 goes from step 104 to step 115 to determine whether a street is on both sides of the display. If not, processor 60 goes to step 116 to center the street that is closest to the center on the display.

Now assuming streets are on both sides (or that processor 60 is coming from step 110 previously described), at step 117 processor 60 determines the best match location on both sides. At step 118, processor 60 moves the Y and θ values based on the difference between the left and right match locations. At step 119, processor 60 determines whether the Y and θ errors are small enough. If not, processor 60 returns to step 117, and if so, processor 60 exits from this routine.

Referring now to FIG. 7, the basic correlation routine is depicted in flow chart form in which processor 60 of FIG. 3 determines whether a best match has occurred between the data under comparison and the predetermined stored data.

In FIG. 7 at step 130, processor 60 sets the index to the center of the screen, and the data is processed starting at the center of the screen and moving up and down toward the edges of the screen.

At step 131, the best fit is set to a maximum, and at step 132 processor 60 accumulates the absolute value of the difference between the reference and the equivalent area of the screen located at the index.

At step 133, processor 60 determines whether the error is less than the best fit. If not, processor 60 goes to step 135 to move the index away from the center.

If the error is less than the best fit, processor 60 goes to step 134 to set the best fit equal to the error and set the best index equal to the index and goes on to step 135.

At step 135, processor 60 determines whether the processing has hit the edge of the screen, and if not, returns to step 132. If processor 60 has hit the edge of the screen, the routine goes to step 137, in which the street is located at the best index.

Upon finding the best index, processor 60 determines that the best match has been found and that the wafer has been aligned in its best position for cutting purposes.

The necessary control signals for aligning the semiconductor wafer 10 on chuck 11 are generated and utilized with a programmed dicing saw such as described above through techniques that would be known to those skilled in the art.

Although the preferred embodiment has been described in conjunction with a pattern recognition system and method for use with aligning semiconductor wafers, it is clear that other objects and features of the present invention are apparent.

For example, it is not necessary to first electronically smear the input data signals and then digitize the smeared data signals. Instead, the present technique could first digitize the input data and then electronically smear the dititized signals.

It is to be understood that the present invention is therefore not to be limited to dicing saws, but could be used with other pattern recognition systems, such as for checking dies and for checking for scratches on semiconductor wafers.

What is claimed is:

1. An object alignment system comprising
    means for optically scanning an object to generate first data signals representing the reflected light level of said scanned object,
    integrator means connected to receive said first data signals for averaging said first data signals to form second data signals representing electronically smeared data signals for each scan line of said scanned object, and
    means for determining the best match between said averaged data signals and predetermined stored data signals without regard or dependence upon the sharpness of said averaged data signals.

2. A system as in claim 1 wherein said means for determining include means for determining the smallest difference between said stored data signals and said averaged signals.

3. A system as in claim 1 wherein said means for optically scanning include means for forming first data signals representing split-field data signals which represent at least two different portions of said scanned object.

4. A system as in claim 1 including means for digitizing said first data signals.

5. A system as in claim 1 including means for digitizing said second data signals.

6. A system as in claim 5 including synchronization means for synchronizing said integrator means and said means for determining.

7. A system as in claim 6 wherein said object is a semiconductor wafer.

8. In an object alignment system, the method comprising the steps of optically scanning an object to generate first data signals representing the reflected light level of said scanned object,
    averaging said first data signals to form second data signals representing an electronically smeared data signal for each scan line of said scanned object, and
    comparing said averaged data signals with predetermined stored data signals to determine the best match therebetween without regard or dependence upon the sharpness of said averaged signal.

* * * * *